United States Patent
She et al.

(10) Patent No.: US 12,532,439 B2
(45) Date of Patent: Jan. 20, 2026

(54) MECHANICAL ENCLOSURE

(71) Applicant: Carrier Corporation, Palm Beach Gardens, FL (US)

(72) Inventors: Xu She, Cohoes, NY (US); Vinay Kumar Vinnakota, Telangana (IN); Xuqiang Liao, Manlius, NY (US); Daxesh Kishor Pandya, Telangana (IN); Vijay Lakshmi Bondapalli, Telangana (IN); Sridhar Kumar Adibhatla, Telangana (IN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 178 days.

(21) Appl. No.: 18/152,808

(22) Filed: Jan. 11, 2023

(65) Prior Publication Data

US 2023/0225091 A1 Jul. 13, 2023

Related U.S. Application Data

(60) Provisional application No. 63/266,641, filed on Jan. 11, 2022.

(51) Int. Cl.
*H05K 7/20* (2006.01)
*H05K 7/14* (2006.01)

(52) U.S. Cl.
CPC ........... *H05K 7/209* (2013.01); *H05K 7/1432* (2013.01)

(58) Field of Classification Search
CPC ...... H05K 7/00; H05K 7/1422; H05K 7/1428; H05K 7/1432; H05K 7/20; H05K 7/20136; H05K 7/20154; H05K 7/20172; H05K 7/2039; H05K 7/20409–20418; H05K 7/20509; H05K 7/209; H05K 7/20909; H05K 1/0203; H05K 1/0204; H05K 1/0209; H05K 1/021; H05K 1/0212; H01L 23/367–3677; H02M 7/043; G06F 1/20

See application file for complete search history.

(56) References Cited

U.S. PATENT DOCUMENTS

| | | |
|---|---|---|
| 5,471,850 A | 12/1995 | Cowans |
| 6,116,040 A | 9/2000 | Stark |
| 6,345,507 B1 * | 2/2002 | Gillen ..................... F25B 21/04 136/203 |
| 6,397,618 B1 | 6/2002 | Chu et al. |

(Continued)

FOREIGN PATENT DOCUMENTS

| | | |
|---|---|---|
| CN | 103732993 A | 4/2014 |
| CN | 214256109 U | 9/2021 |

(Continued)

OTHER PUBLICATIONS

EP-2879475-A1 English Translation (Year: 2015).*

(Continued)

*Primary Examiner* — Amir A Jalali
(74) *Attorney, Agent, or Firm* — Drew Folgmann

(57) ABSTRACT

A mechanical enclosure for a power converter is disclosed. In some embodiments, the mechanical enclosure comprises a base; a first compartment configured for receiving one or more electronic devices; and a second compartment configured for receiving a magnetic device, the second compartment formed by a cavity protruding from a bottom surface of the base.

16 Claims, 6 Drawing Sheets

(56) References Cited

U.S. PATENT DOCUMENTS

| | | |
|---|---|---|
| 6,526,768 B2 | 3/2003 | Wall et al. |
| 6,543,246 B2 | 4/2003 | Wayburn et al. |
| 6,687,122 B2 | 2/2004 | Monfarad |
| 6,687,125 B2 | 2/2004 | Park et al. |
| 6,741,469 B1 | 5/2004 | Monfarad |
| 7,342,787 B1 | 3/2008 | Bhatia |
| 7,715,195 B2 | 5/2010 | Bremicker |
| 7,726,145 B2 | 6/2010 | Nakamura |
| 9,032,753 B2 | 5/2015 | Love et al. |
| 9,395,106 B2 | 7/2016 | Voorhis |
| 9,429,151 B2 | 8/2016 | Taras et al. |
| 10,371,396 B2 | 8/2019 | Chi et al. |
| 10,895,389 B2 | 1/2021 | Abe et al. |
| 10,976,062 B2 | 4/2021 | Wang et al. |
| 2003/0173061 A1* | 9/2003 | Lai ................ H01L 23/427 165/185 |
| 2004/0052051 A1* | 3/2004 | Malone ............ H01L 23/427 361/720 |
| 2010/0073876 A1* | 3/2010 | Liu ................ H01L 23/3672 361/696 |
| 2010/0096107 A1* | 4/2010 | Lian ................ H01L 23/427 165/80.3 |
| 2011/0100609 A1* | 5/2011 | Tang .............. H05K 7/20318 165/185 |
| 2014/0321065 A1 | 10/2014 | Nishimura et al. |
| 2018/0010836 A1 | 1/2018 | Hirahara et al. |
| 2020/0056795 A1* | 2/2020 | Mishra ............. F24F 13/30 |
| 2020/0194159 A1* | 6/2020 | Tsuchida .......... H01F 27/2852 |
| 2021/0298206 A1* | 9/2021 | Mandal ........... H05K 7/20836 |
| 2022/0142011 A1* | 5/2022 | Doo ............... H05K 7/20927 361/697 |
| 2022/0338390 A1* | 10/2022 | She ................ H05K 7/2089 |
| 2023/0328936 A1* | 10/2023 | Sun ................. H02M 1/327 361/704 |

FOREIGN PATENT DOCUMENTS

| | | | |
|---|---|---|---|
| CN | 113872454 A | 12/2021 | |
| DE | 202014005237 U1 | 9/2014 | |
| EP | 1079432 A1 | 2/2001 | |
| EP | 2830073 A1 | 1/2015 | |
| EP | 2879475 A1 * | 6/2015 | ........... H05K 7/1432 |
| EP | 2475080 B1 | 10/2017 | |
| EP | 2146151 B1 | 10/2018 | |
| JP | 2017123733 A * | 7/2017 | |
| KR | 20120042343 A | 5/2012 | |
| WO | 2014080462 A1 | 5/2014 | |
| WO | 2021022192 A1 | 2/2021 | |

OTHER PUBLICATIONS

JP-2017123733-A English Translation (Year: 2017).*
Extended European Search Report received for EP Application No. 23151029.8, mailed on Jun. 2, 2023, 08 Pages.

* cited by examiner

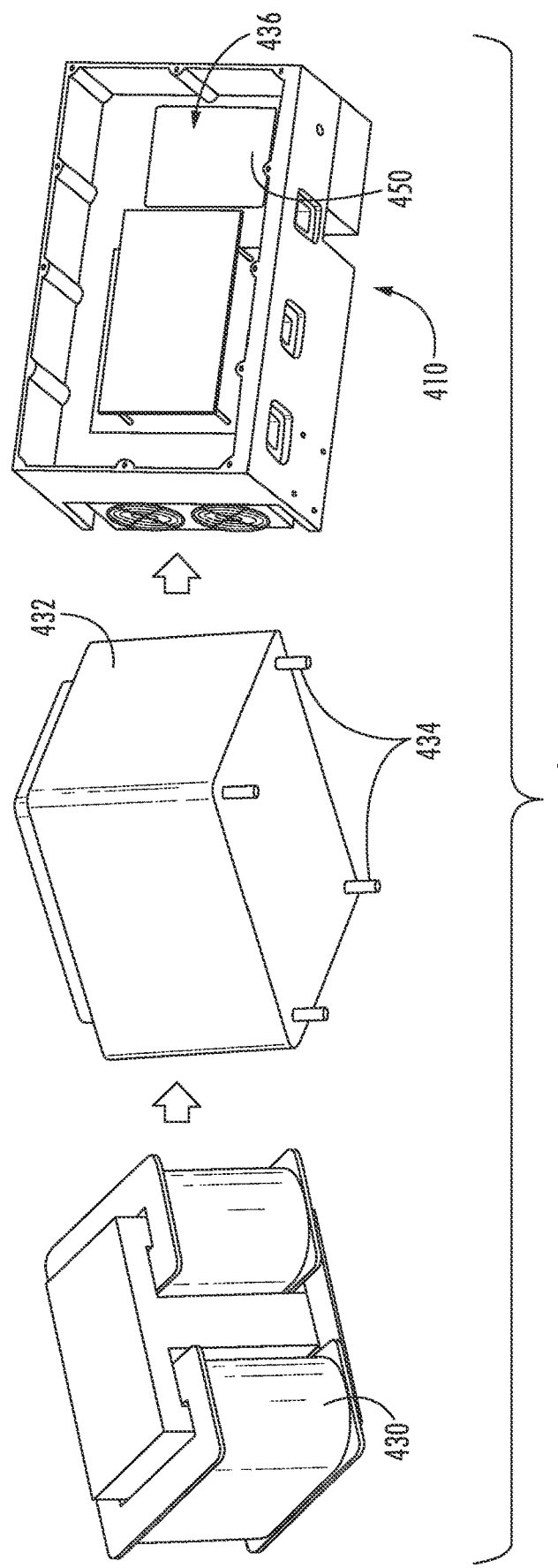

MECHANICAL ENCLOSURE

CROSS REFERENCE TO RELATED APPLICATIONS

This application claims the benefit of U.S. Provisional Patent Application No. 63/266,641 filed on Jan. 11, 2022, the entirety of which is incorporated by reference herein.

BACKGROUND

The invention relates generally to mechanical enclosures and, more specifically, to mechanical enclosures for power converters.

Power converters may sometimes require high ingression protection (IP) rating as well as air-cooled thermal management. In addition, a converter with a magnetic component may be needed to extend the operating voltage range. These unique requirements may pose challenges in designing a high-density mechanical package.

BRIEF DESCRIPTION

Aspects of the disclosure relate to methods, apparatuses, and/or systems for manufacturing and assembling a mechanical enclosure for a power converter.

In some embodiments, a mechanical enclosure for a power converter is provided. In some embodiments, the mechanical enclosure comprises a base; a first compartment configured for receiving one or more electronic devices; and a second compartment configured for receiving a magnetic device, the second compartment formed by a cavity protruding from a bottom surface of the base.

In some embodiments, the mechanical enclosure comprises one or more cooling systems. The one or more cooling systems comprise: a first cooling system, operatively connected to an outer surface of the first compartment, the first cooling system configured for cooling the first compartment; and a second cooling system, operatively connected to an outer surface of the second compartment, the second cooling system configured for cooling the second compartment.

In some embodiments, the one or more cooling systems comprise one or more cooling fins.

In some embodiments, the first cooling system comprises a first set of cooling fins and the second cooling system comprises a second set of cooling fins, and wherein the first and second set of cooling fins have different orientations.

In some embodiments, the orientation of the first set of fins is perpendicular to the second set of fins.

In some embodiments, the first set of cooling fins protrudes from an outer side of the bottom surface of the base.

In some embodiments, the second set of cooling fins protrudes from an outer wall of the cavity.

In some embodiments, the mechanical enclosure comprises a fan configured to drive air through the one or more cooling systems.

A method for manufacturing a mechanical enclosure for a power converter is provided. In some embodiments, the method comprises providing a base; providing a first compartment for receiving one or more electronic devices; and providing a second compartment for receiving a magnetic device, the second compartment formed by a cavity protruding from a bottom surface of the base.

In some embodiments, the method comprises providing one or more cooling systems. The one or more cooling systems comprises: a first cooling system, operatively connected to an outer surface of the first compartment, the first cooling system configured for cooling the first compartment; and a second cooling system, operatively connected to an outer surface of the second compartment, the second cooling system configured for cooling the second compartment.

In some embodiments, the method comprises providing a fan for driving air through the one or more cooling systems.

In some embodiments, the magnetic device is pre-potted.

A method for assembling a mechanical enclosure for a power converter is provided. the method comprise: providing a base; providing a first compartment for receiving one or more electronic devices; providing a second compartment for receiving a magnetic device, the second compartment formed by a cavity protruding from a bottom surface of the base; pre-potting the magnetic device; placing the pre-potted magnetic device in the cavity; and assembling the one or more or more electronic devices in the first compartment.

Various other aspects, features, and advantages of the invention will be apparent through the detailed description of the invention and the drawings attached hereto. It is also to be understood that both the foregoing general description and the following detailed description are examples and not restrictive of the scope of the invention.

BRIEF DESCRIPTION OF THE DRAWINGS

FIG. 4 shows an exemplary assembly placing a magnetic device in a housing that may be placed within an enclosure, according to one or more embodiments.

DETAILED DESCRIPTION

In the following description, for the purposes of explanation, numerous specific details are set forth in order to provide a thorough understanding of the embodiments of the invention. It will be appreciated, however, by those having skill in the art that the embodiments of the invention may be practiced without these specific details or with an equivalent arrangement. In other cases, well-known structures and devices are shown in block diagram form in order to avoid unnecessarily obscuring the embodiments of the invention.

Disclosed herein is an enclosure for a power converter. Generally power converters may include electronic and magnetic devices. In some embodiments, to meet high ingression protection (IP) rating, the power converter may require a high-density mechanical enclosure. Generally, the IP rating require a degree of protection (of the magnetic device, the user, or the environment) against dust, particles, water, or other elements. Disclosed herein is a high-density mechanical enclosure configured for housing one or more electronic and magnetic devices while meeting a high IP rating. For example, the enclosure may be configured to meet the IP67 requirements (dust-tight and can be immersed in one meter of water for up to 30 minutes). That said, the enclosure may be configured for meeting requirements for other IP ratings. In some embodiments, the enclosure may be configured to dissipate heat (e.g., generated by the electronic and the magnetic devices) and provide cooling to the power converter.

In some embodiments, the enclosure may include one or more compartments. For example, a first compartment may be configured for housing one or more electronic devices (e.g., semiconductor devices) and a second compartment may be configured for housing a magnetic device. In some embodiments, the enclosure may include one or more sets of cooling systems for cooling the compartments where the electronic devices and the magnetic device are housed. In some embodiments, the one or more cooling systems may include a first set of cooling fins for cooling the electronic devices. The first set of cooling system may be configured to extend from a bottom side of the first compartment. In some embodiments, the one or more cooling systems may include a second set of fins for cooling the magnetic device. In some embodiments, the second set of fins may extend from the outer sides of the second compartment. In some embodiments, the first set and second set of fins have different orientations.

In some embodiments, one or more fans may be used to drive air through the cooling fins. For example, in some embodiments, the one or more fans may be attached to a back side of the enclosure (e.g., adjacent to the electronic device compartment). In some embodiments, the one or more fans may be configured to drive airflow through to the first set of fins and the second set of fins. Thereby cooling both compartments.

Figure 1:
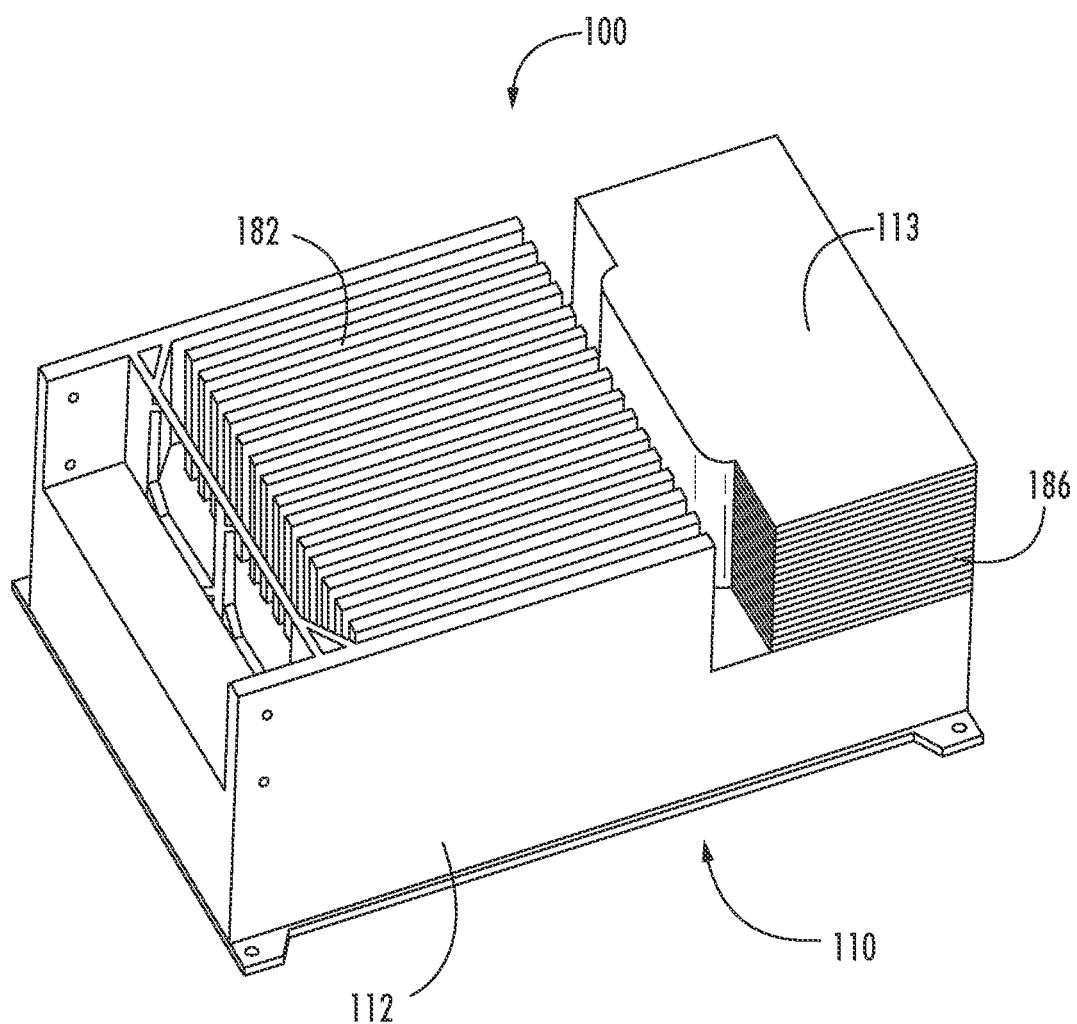
FIG. 1 is a perspective side view of an example of a power converter, in accordance with one or more embodiments.

FIG. 1 is a perspective view of a power converter 100 according to one or more embodiments. Power converter 100 may include an enclosure 110. Enclosure 110 includes a first compartment 112 configured to house one or more electronic devices. Enclosure 110 includes a second compartment 113 configured to house a magnetic device. Compartment 112 includes a first set of fins 182 configured for cooling second compartment 113. The first set of fins 182 and the second set of fins 186 are of different orientation (e.g., one set of fins may be viewed to be vertical and the other set of fins may be viewed to be horizontal).

Figure 2:
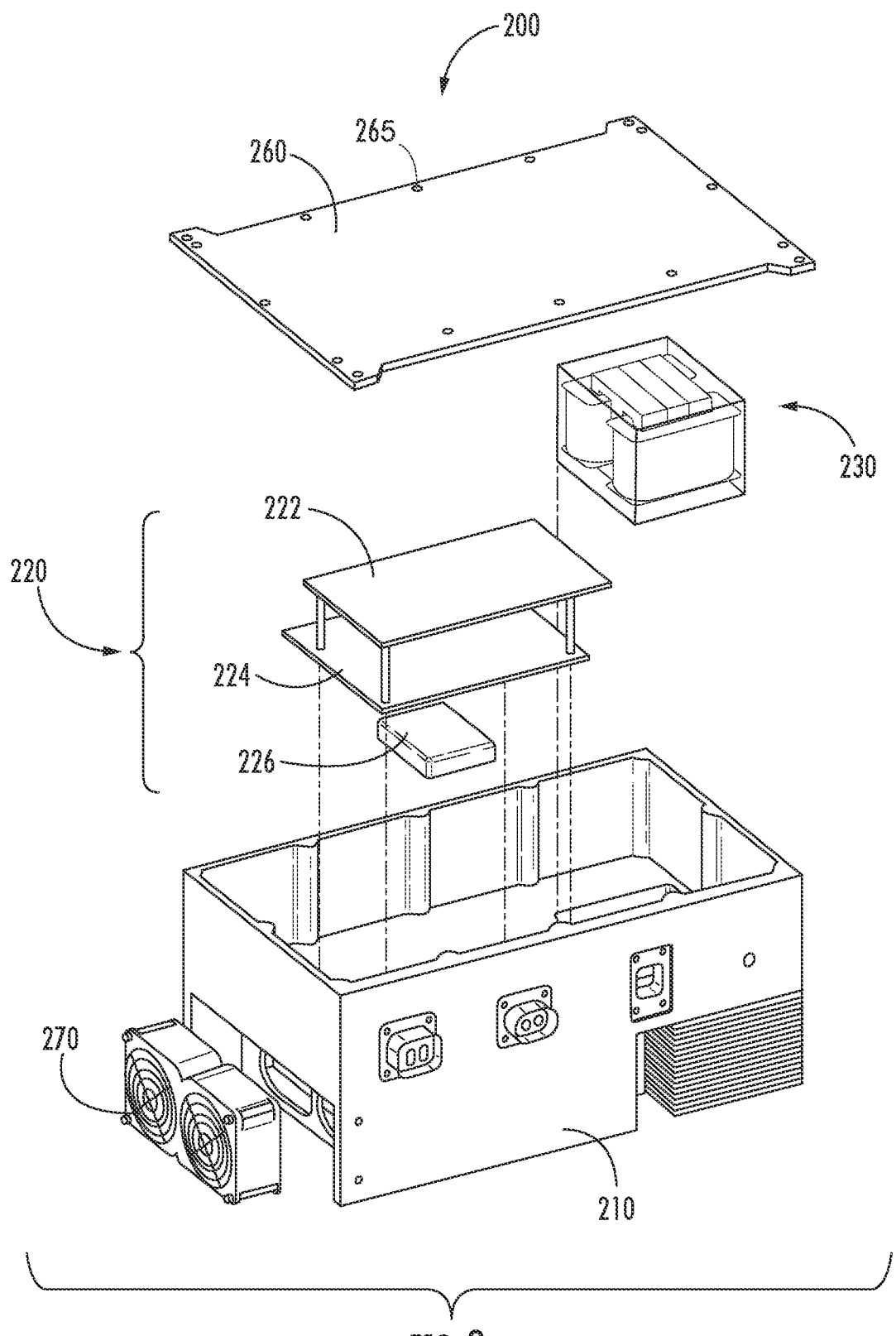
FIG. 2 is an exploded view of an exemplary power converter, according to one or more embodiments.

FIG. 2 is an exploded view of a power converter 200, according to one or more embodiments. In some embodiments, power converter 200 may include an enclosure 210. Enclosure 210 may be configured to receive one or more components of the power converter. In some embodiments, power converter 200 may include a printed circuit board assembly 220, an electromagnetic device 230, a cover 260, fans 270, or other components.

Figure 3:
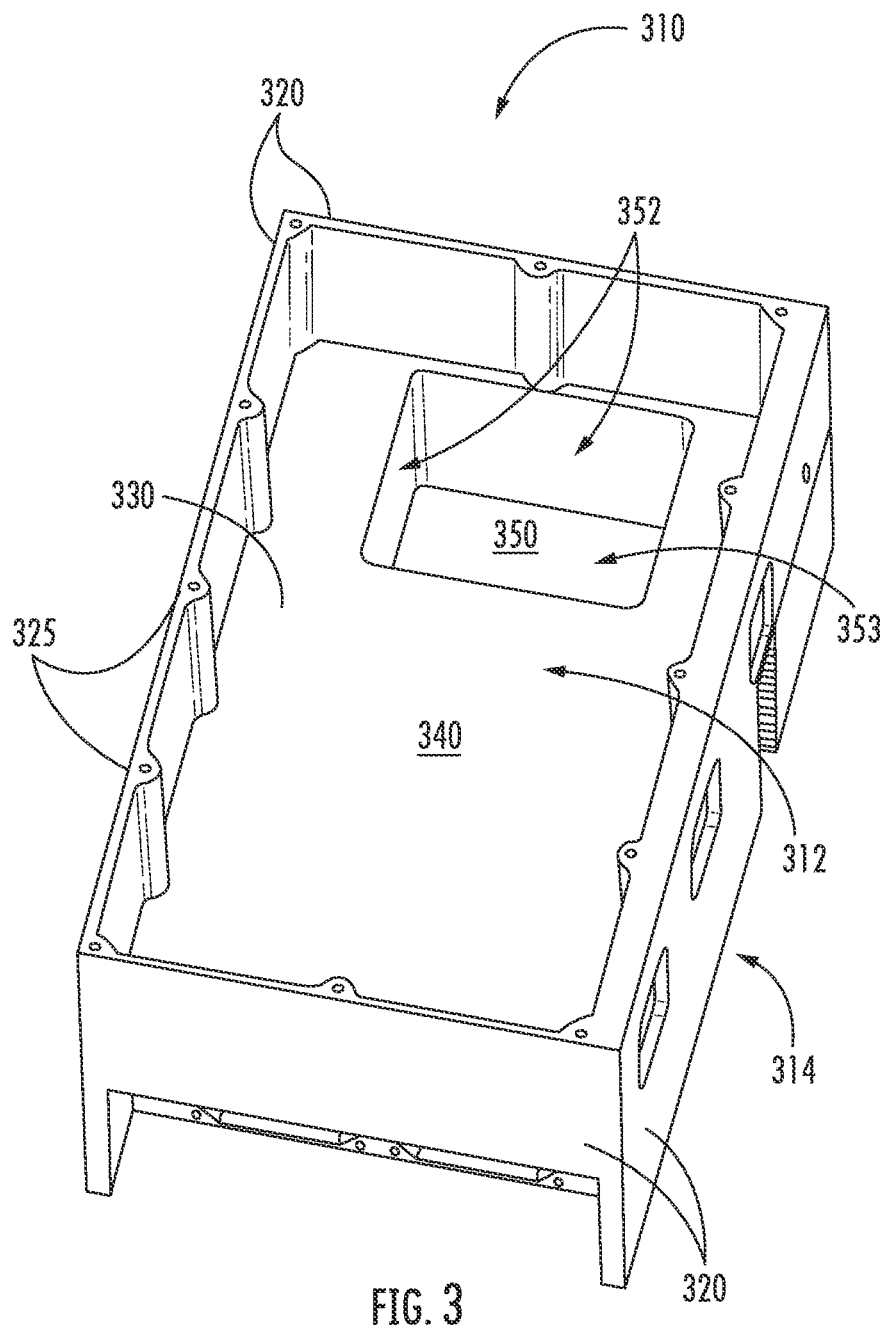
FIG. 3 a perspective view of an example of an enclosure, in accordance with one or more embodiments.
Figure 5C:
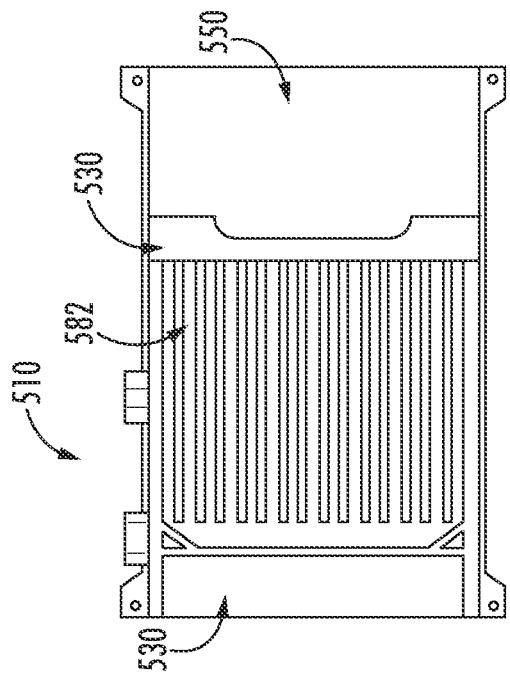
FIGS. 5A-D are perspective views of an exemplary enclosure, in accordance with one or more embodiments.
Figure 5D:
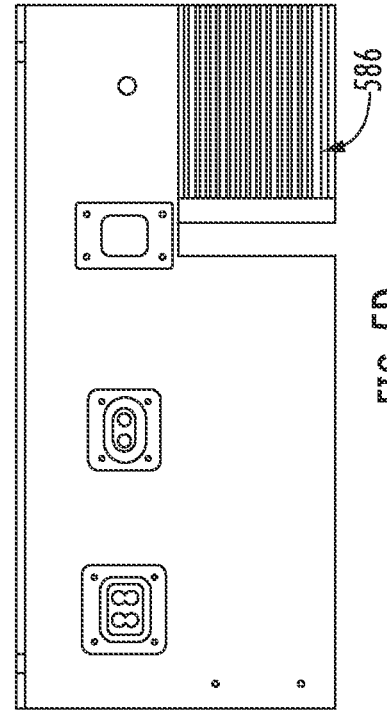
Figure 5A:
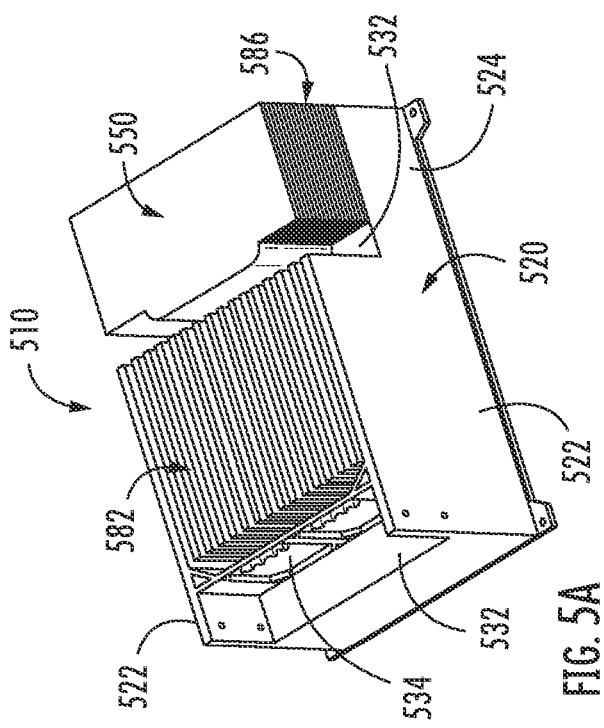
Figure 5B:
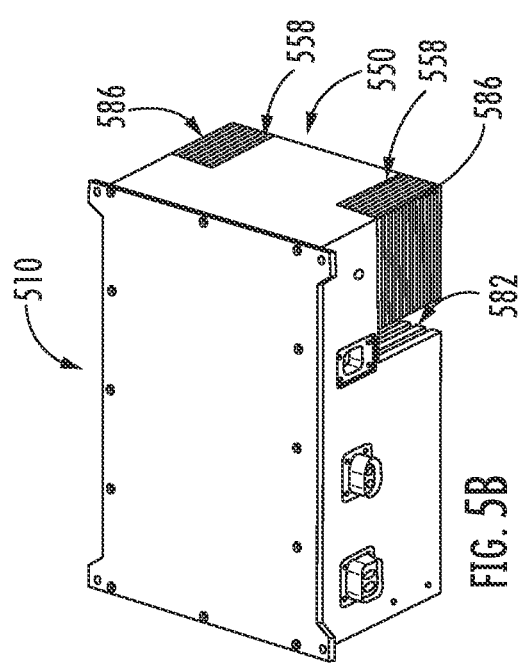

FIG. 3 is a perspective view of an enclosure 310, according to one or more embodiments. In some embodiments, enclosure 310 may include one or more side walls 320, and a base 330. In some embodiments, side walls 320 may be configured to surround base 330. In some embodiments, side walls 320 may connect to one or more sides (or edges) of base 330. Side walls 320 may be configured to extend from base 330 towards a top side 312 of the enclosure 310 to form inner space 340 of the enclosure. In some embodiments, side walls 320 may extend from base 330 towards a bottom side 314 of enclosure 310 (opposite to top side 312).

In some embodiments, side walls 320 may include a plurality of connecting spaces 325 configured for receiving connecting members to connect a cover to enclosure 310. In some embodiments, connecting spaces 325 may be in the form of holes, tabs, sleeves, casings, or other connecting space for receiving a connecting member. Connecting spaces 325 may be formed in walls 320 (e.g., integrally), or may be joined to walls 325 by other connecting means (glued, welded, screwed, etc.). FIG. 2 shows an example of a cover 260 configured for covering enclosure 210. Cover 260 may include one or more connecting spaces 265 configured for receiving connecting members (e.g., bolts, screws, pins, etc.) to connect cover 260 to enclosure 210. In some embodiments, one or more connecting spaces 265 may be configured to align with one or more connecting spaces 325 of the enclosure (to facilitate receiving the connecting members by connecting spaces 325). In some embodiments, connecting spaces 265 of the cover may be in the form of holes (or other forms configured for receiving connecting members or facilitating connection of the cover with the enclosure).

Returning to FIG. 3, in some embodiments, inner space 340 of the enclosure is defined by base 330 and side walls 320. Inner space 340 may be configured for receiving one or more electronic components. The area of inner space 340 that houses the electronic components may form the first compartment of the enclosure (as shown in FIG. 1). FIG. 2 shows an example of a printed circuit board assembly (PCBA) 220. In some embodiments, PCBA 220 may include a control board 222, a power board 224, an insulated-gate bipolar transistor assembly (IGBT) 226, or other electronic components.

Returning to FIG. 3, in some embodiments, base 330 may include a cavity 350. Cavity 350 may be configured to house a magnetic device (e.g., magnetic device 230 shown in FIG. 2). Cavity 350 protrudes downwardly from a bottom surface of base 330. In some embodiments, cavity 350 may include one or more side walls 352 and a bottom surface 353. The side walls 352 may connect to one or more sides (or edges) of bottom surface 353. Side walls 352 may be configured to extend from bottom surface 353 towards top side 312 of the enclosure 310 to form cavity 350.

It is to be noted that the above example of cavity 350 is for illustrative purposes only and is not intended to be limiting. It will be apparent to those skilled in the art, that other cavity shapes, dimensions, location, or other characteristics of the cavity may be used. For example, in some embodiments, cavity 350 may be formed based on an overall architecture of the power converter (e.g., in a shape, geometry, dimension, or location to accommodate the electromagnetic device or the other components of the power converter).

In some embodiments, a potting glue may be used to partially fill cavity 350. The potting glue may be disposed on the bottom surface 353 of cavity 350. The magnetic device may be disposed on the potting glue and gaps between the side walls 352 and the magnetic device may be completely filled with the potting glue without any gaps to stabilize the magnetic device within cavity 350. This is to ensure connectivity of metal enclosure with the potting for heat transfer from the magnetic device to enclosure. It is to be noted, as it will be apparent to those skilled in the art, that the amount of potting glue used may to stabilize the magnetic device within cavity 350 may depend on the size or shape of cavity 350 and/or the electromagnetic device.

In some embodiments, the magnetic device may be pre-potted before being placed in cavity 350. FIG. 4 illustrates an exemplary assembly placing a magnetic device in a housing 432 that may be placed within an enclosure 410 according to one or more embodiments. In some embodiments, magnetic device 430 may be an inductor or transformer. In some embodiments, device 430 may be pre-potted within a housing 432 having one or more pegs 434 configured to support device 430 within cavity 450 of enclosure 410. In some embodiments, housing 432 may be configured to meet a high IP rating. For example, in some embodiments, housing 432 may have an IP rating of 67 (IP67). Housing 432 may be configured for other IP ratings according to one or more embodiments. In some embodiments, a cover 436 may be used to seal the magnetic device 430 in cavity 450.

FIGS. 5A-D illustrate multiple views of an enclosure 510, according to one or more embodiments. In some embodiments, enclosure 510 may include one or more cooling systems. The one or more cooling systems may include one or more sets of fins disposed (or operatively connected to) on the outer side of the enclosure to help with heat dissipation. In some embodiments, the one or more sets of fins may extend from a base outer surface 532 of base 530, opposite the inner space of enclosure 510 (not shown here). In some embodiments, enclosure 510 may include a first set of fins 582 disposed on portion 534 of base outer side 532, opposite to the portion of the inner space that houses the printed circuit boards (placed on the first compartment). In some embodiments, the first set of fins 582 may extend vertically from portion 534 of outer side 532 of base 530. In some embodiments, the first set of fins 582 may be placed between portions 522 of side walls 520. This configuration of the first set of fins 582 may help dissipate heat of the power converter, especially heat from the printed circuit boards.

In some embodiments, enclosure 510 may include a second set of fins 586. In some embodiments, the second set of fins 586 may be disposed on (or protrude from) an outer surface 558 of side walls 524 of the enclosure cavity 550 (e.g., placed on one or more sides of the second compartment). In some embodiments, the second set of fins 586 may extend horizontally from both sides of cavity 550. The second set of fins 586 may help dissipate heat from the power converter, especially heat from the electromagnetic device. In some embodiments, the first set of fins 582 and the second set of fins 586 are disposed (or assembled) outer surface 532 of base 530 such that the fins of the first set are perpendicular to the fins of the second set. In some embodiments, one or more fans (e.g., fans 270 shown in FIG. 2) may be placed in front of the first set of fins 582. The one or more fans may be configured to drive air across the first set of fins 582. Air flow caused by the one or more fans may also be driven across the second set of fins 586 cooling cavity 550 as a result. The IP rating of the fan should meet the same requirement as the system.

Figure 6:
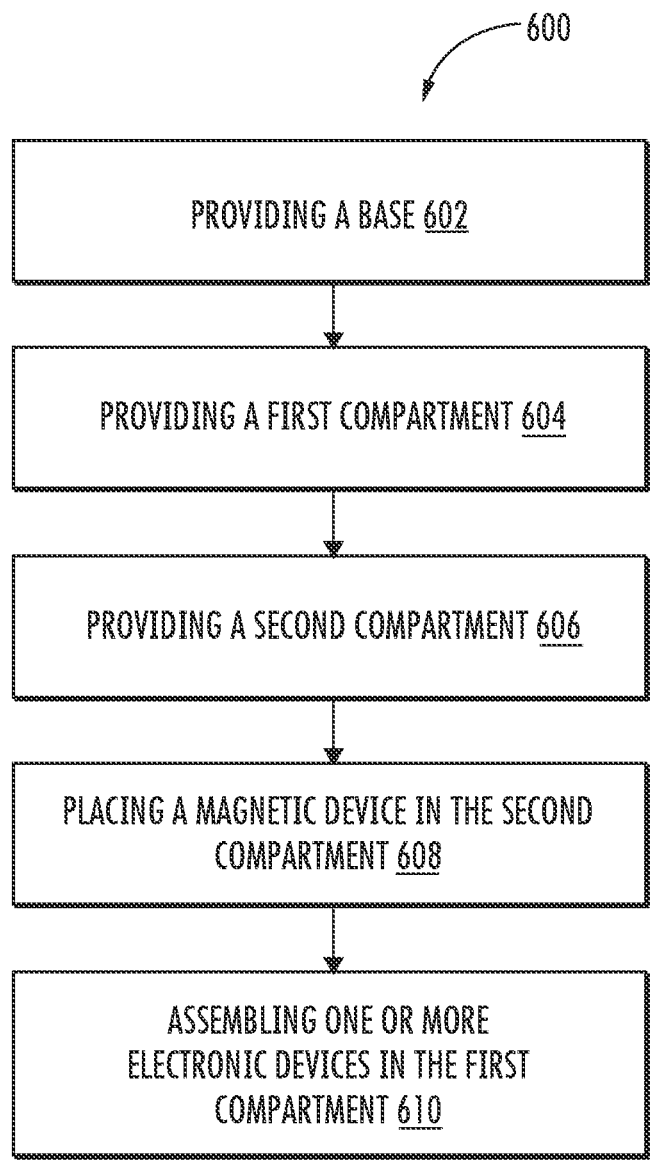
FIG. 6 shows a flow diagram illustrating an example of a method for assembling a mechanical enclosure, in accordance with one or more embodiments.

FIG. 6 shows a flow diagram illustrating an example of a method 600 for assembling a mechanical enclosure, in accordance with one or more embodiments.

At an operation 602 of method 600, an enclosure base may be provided. In some embodiments, a base may be the same as or similar to base 330 (shown in FIG. 3 and described herein).

At an operation 604 of method 600, a first compartment may be provided. In some embodiments, the first compartment may be configured for receiving one or more electronic devices. In some embodiments, the first compartment may be the same as or similar to inner space 340 (shown in FIG. 3 and described herein).

At an operation 606 of method 600, a second compartment for receiving a magnetic device may be provided. In some embodiments, the second compartment may be formed by a cavity protruding from a bottom surface of the base. In some embodiments, second compartment may be the same as or similar to cavity 350 (shown in FIG. 3 and described herein).

At an operation 608 of method 600, a magnetic device may be placed in the second compartment. In some embodiments, the magnetic device may be pre-potted before placing in the cavity. In some embodiments, the magnetic device may be the same or similar to magnetic device 430 (shown in FIG. 4 and described herein).

At an operation 610 of method 600 one or more electronic devices may be assembled in the first compartment. In some embodiments, the electronic device may be the same or similar to electronic device 220 (shown in FIG. 2 and described herein).

It should be understood that the description and the drawings are not intended to limit the invention to the particular form disclosed, but to the contrary, the intention is to cover all modifications, equivalents, and alternatives falling within the spirit and scope of the invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

What is claimed is:

1. A mechanical enclosure for a power converter, the enclosure comprising:
   a base comprising a level surface;
   a first compartment configured for receiving one or more electronic devices above the level surface of the base;
   a second compartment configured for receiving a magnetic device, the second compartment formed by a cavity recessed below the level surface of the base;
   a cover in the first compartment configured to completely seal the magnetic device within the cavity; and
   a first set of cooling fins and a second set of cooling fins, wherein the first set of cooling fins is perpendicular to the second set of fins.

2. The mechanical enclosure of claim 1, further comprising:
   one or more cooling systems, the one or more cooling systems comprising:
   a first cooling system, operatively connected to an outer surface of the first compartment, the first cooling system configured for cooling the first compartment; and
   a second cooling system, operatively connected to an outer surface of the second compartment, the second cooling system configured for cooling the second compartment.

3. The mechanical enclosure of claim 2, wherein the one or more cooling systems comprise the first set of cooling fins and the second set of cooling fins.

4. The mechanical enclosure of claim 2, further comprising a fan configured to drive air through the one or more cooling systems.

5. The mechanical enclosure of claim 1, wherein the first set of cooling fins protrudes from an outer side of the level surface of the base.

6. The mechanical enclosure of claim 1, wherein the second set of cooling fins protrudes from an outer wall of the cavity.

7. The mechanical enclosure of claim 6, wherein the second set of cooling fins comprises two discrete sections disposed on opposite ends of an outer wall of the cavity.

8. The mechanical enclosure of claim 1, wherein the cavity is entirely recessed below the level surface of the base.

9. A method for manufacturing a mechanical enclosure for a power converter, the method comprising:
   providing a base comprising a level surface;
   providing a first compartment for receiving one or more electronic devices above the level surface of the base;
   providing a second compartment for receiving a magnetic device, the second compartment formed by a cavity recessed below the level surface of the base; and
   a cover in the first compartment configured to completely seal the magnetic device within the cavity; and
   a first set of cooling fins and a second set of cooling fins, wherein the first set of cooling fins is perpendicular to the second set of fins.

10. The method of claim 9, further comprising:
    providing one or more cooling systems, the one or more cooling systems comprising:
    a first cooling system, operatively connected to an outer surface of the first compartment, the first cooling system configured for cooling the first compartment; and
    a second cooling system, operatively connected to an outer surface of the second compartment, the second cooling system configured for cooling the second compartment.

11. The method of claim 10, wherein the one or more cooling systems comprise the first set of cooling fins and the second set of cooling fins.

12. The method of claim 10, further comprising:
    providing a fan for driving air through the one or more cooling systems.

13. The method of claim 9, wherein the first set of cooling fins protrudes from an outer side of the level surface of the base.

14. The method of claim 9, wherein the second set of cooling fins protrudes from an outer wall of the cavity.

15. The method of claim 9, wherein the magnetic device is pre-potted, and wherein providing the second compartment for receiving the magnetic device comprises providing the second compartment for receiving the pre-potted magnetic device within a housing, the housing having one or more pegs configured to support the pre-potted magnetic device within the cavity of the enclosure.

16. A method for assembling a mechanical enclosure for a power converter, the method comprising:
    providing a base comprising a level surface;
    providing a first compartment for receiving one or more electronic devices above the level surface of the base;
    providing a second compartment for receiving a magnetic device, the second compartment formed by a cavity recessed below the level surface of the base;
    providing a cover in the first compartment configured to completely seal the magnetic device within the cavity;
    providing a first set of cooling fins and a second set of cooling fins, wherein the first set of cooling fins is perpendicular to the second set of fins:
    pre-potting the magnetic device;
    placing the pre-potted magnetic device in the cavity;
    filling the remaining gap of cavity with additional potting material; and
    assembling the one or more or more electronic devices in the first compartment.

* * * * *